United States Patent [19]

Flies et al.

[11] Patent Number: 4,578,573

[45] Date of Patent: Mar. 25, 1986

[54] PORTABLE ELECTRONIC INFORMATION DEVICES AND METHOD OF MANUFACTURE

[75] Inventors: William P. Flies, Burnsville; William H. Wehrmacher, Prior Lake, both of Minn.

[73] Assignee: Datakey, Inc., Burnsville, Minn.

[21] Appl. No.: 477,905

[22] Filed: Mar. 23, 1983

[51] Int. Cl.⁴ .................................................. G06K 19/06
[52] U.S. Cl. ....................................... 235/492; 361/406
[58] Field of Search .................... 235/492; 361/406; 340/825.31

[56] References Cited

U.S. PATENT DOCUMENTS

| | | | |
|---|---|---|---|
| 3,122,996 | 3/1964 | Heatwole | 235/492 X |
| 3,678,250 | 7/1972 | Dethloff et al. | 235/492 X |
| 3,702,464 | 11/1972 | Castrucci | 235/492 |
| 4,420,794 | 12/1983 | Anderson | 361/419 |
| 4,436,993 | 3/1984 | Flies | 235/492 X |
| 4,463,218 | 7/1984 | Suzuki | 361/406 X |

FOREIGN PATENT DOCUMENTS

WO83/00976 3/1983 PCT Int'l Appl. .

*Primary Examiner*—David L. Trafton
*Attorney, Agent, or Firm*—Vidas & Arrett

[57] ABSTRACT

Key-like portable information electronic devices and other electronic devices adapted to be inserted into mating electrical receptacles. The bodies of devices in their preferred embodiments are formed of plastic molded around a printed circuit substrate, the barrels of which, when positioned on edges of the board, are modified so as to function as electrical contacts.

18 Claims, 14 Drawing Figures

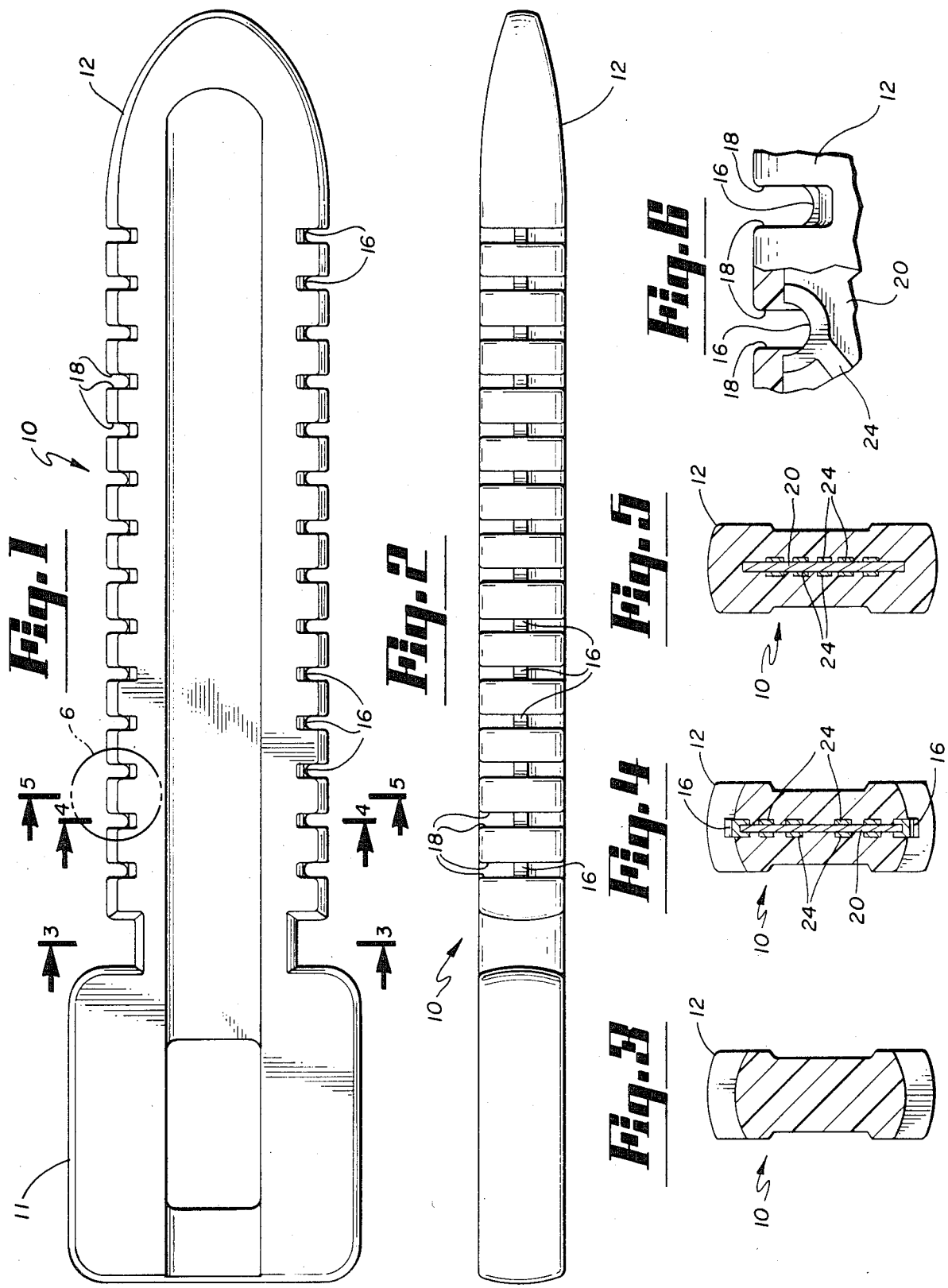

PORTABLE ELECTRONIC INFORMATION DEVICES AND METHOD OF MANUFACTURE

DESCRIPTION

BACKGROUND OF THE INVENTION

This invention relates to improvements in the functional design of electrical insertion devices such as key-like devices, credit card devices and identification tag devices and the like adapted for insertion into electrical receptacles. The invention is an improvement over the inventions of U.S. Pat. No. 4,297,569 issued Oct. 27, 1981 entitled "Microelectronic Memory Key With Receptacle and Systems Therefore", U.S. Pat. No. 4,326,125, issued Apr. 20, 1982, entitled "Improved Microelectronic Memory Key With Receptacle and Systems Therefor"; U.S. Pat. No. 4,379,966, issued Apr. 12, 1983 entitled "Receptacle For Electronic Information Key" and U.S. Pat. No. 4,436,993, issued Mar. 13, 1984 Electronic Key".

Electrical devices of various types have been proposed in which a master circuit or electrical operating system of some kind, such as a computer system, is activated by use of a portable device which is combined with the electrical system, as by insertion of the device into a slot or the like, to make electrical contact or connection with the system. This invention is concerned broadly with such portable devices and with such systems. However, it is specifically concerned with improved insertion devices per se which are inserted into the electrical receptacles of said systems. The devices carry an electronic circuit means which may take the form of a data carrying embedded circuit component. As already noted, such devices and receptacles therefor have been described in several patents and patent applications. The key-like devices of these aforementioned patent and patent applications retain a relatively large amount of data in a portable medium of small size. Very fast data access and data transfer rates are provided by electrical connection of such devices to a master electrical circuit means including a program memory and a processor by insertion of the key-like device into specially designed electrical receptacles.

It is a general object of this invention to provide improved insertion devices and a new method of manufacturing such devices.

It is a specific object of this invention to provide insertion devices in the form of credit cards and identification tags, preferred embodiments of which are referred to herein collectively as "devices of substantially flat form" or with similar language, or any other suitable form all of which are of improved and simplified design and manufacture. It is also a specific object of this invention to provide improved key-like devices.

BRIEF SUMMARY OF THE INVENTION

As already indicated, the aforementioned patents and applications describe a key-like device which, in its preferred form as a microelectronic data key, provides relatively large amounts of data bits storage with very fast access time, while being packaged in a durable medium. The microelectronic data key described therein is not only concerned with the storage of data and its introduction into a computer or other electrical circuit, but also with the portability of microelectronic circuits, chips, or dies, whether the purpose of the electrical circuit system into which the key is introduced is the storage of information or any other purpose, such as a control function.

The various circuit elements which may be embedded in such a key are packaged in a sturdy configuration which may be inserted into an electrical receptacle which is electrically connected to an access device or the like for a variety of purposes. Any circuit means which can be so packaged and which can augment any other existing circuit contained in the master operating system is usable in such a key or similar insertion device. Such insertion devices are specifically designed for insertion into an electrical receptacle to establish contact through the receptacle to the master electrical system. The present invention improves the design and manufacture of such key-like insertion devices and other similar insertion devices, such as flat credit card devices, and flat identification tag devices, by providing a design in which holes in a printed circuit substrate, carrying the electrical circuit means, are adapted and incorporated into the device in such a way that they function as the electrical contacts for the device in the electrical receptacle into which it is inserted.

BRIEF DESCRIPTION OF THE DRAWINGS

FIG. 1 is a side elevational view of one embodiment of a key-like insertion device incorporating the invention.

FIG. 2 is a top plan view of the device of FIG. 1.

FIG. 3 is a sectional view taken along line 3—3 of FIG. 1.

FIG. 4 is a sectional view taken along line 4—4 of FIG. 1.

FIG. 5 is a sectional view taken along line 5—5 of FIG. 1.

FIG. 6 is a detailed view taken at 6 of FIG. 1 and enlarged with parts cut away.

DETAILED DESCRIPTION OF THE INVENTION

Figure 7:
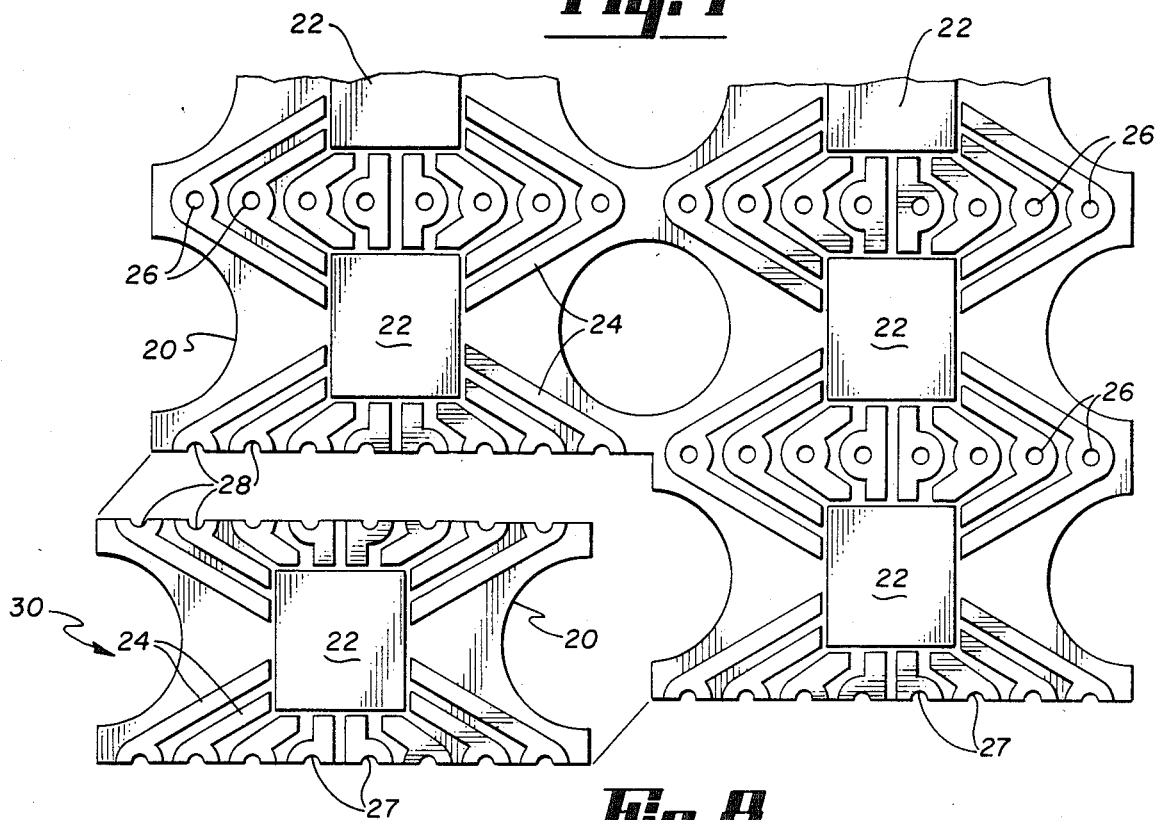
FIG. 7 is a face view of a typical printed circuit board array of individual circuit substrate segments arranged in repetitive fashion with one circuit substrate segment cut-out and parted therefrom.

FIGS. 1 through 6, show a portable random access data device in the form of a key-like insertion device generally designated 10. Key 10 comprises non-conductive head and insert body portions 11 and 12, respectively. The insert body portion 12 contains a circuit element, such as an integrated circuit or microelectric chip embedded therein. Electrical contacts 16, which are connected to the embedded electrical circuit means by an arrangement described further hereinbelow, lie disposed within spaced contact grooves 18 on the opposite surfaces or edges of the key to form electrical contact areas therefor. The keys may be of various shapes, different lengths and so forth may include a different number of grooves and contacts. Additionally, as will be seen below, the insertion devices may be of other shapes as well as the key-like shapes described in this instance.

Figure 8:
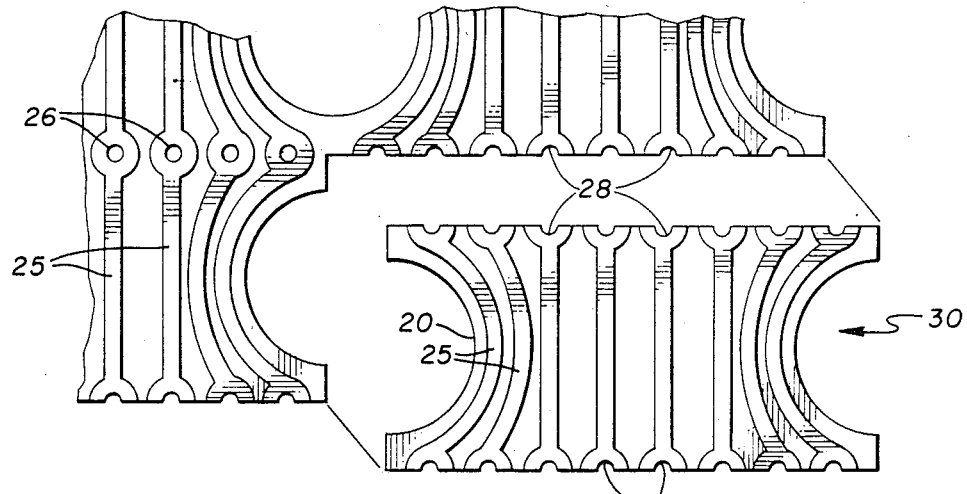
FIG. 8 is an opposite face view of the separated segment of circuit and substrate shown in FIG. 7.
Figure 9:
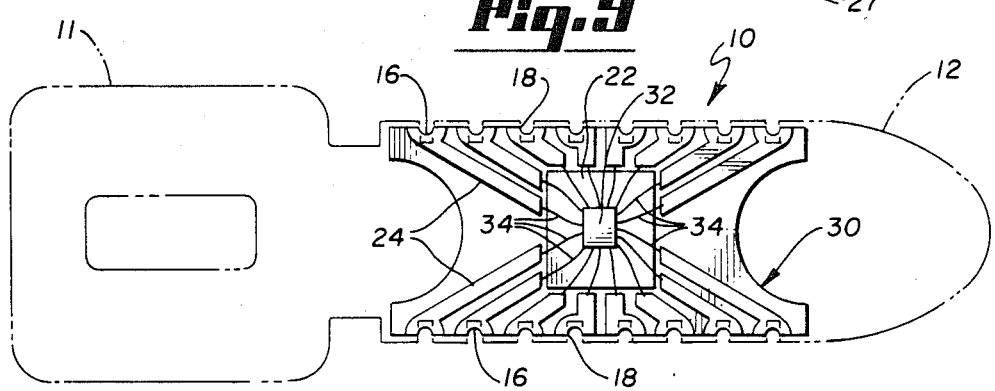
FIG. 9 is a side elevational view of a printed circuit substrate segment positioned within a key-like insertion device with the key body shown in phantom line.

Further structural details of a typical key of the type shown in FIGS. 1 and 2 will become apparent upon considering the manner of its manufacture with reference to FIGS. 7-9 along with FIGS. 3-6. It should be noted that the number of electrical contacts included in the key can vary as desired. This can be seen from the different number of contacts shown in FIGS. 1-6 as compared to those shown in FIGS. 7-9.

FIG. 7 shows an array of printed circuit boards manufactured in accordance with known printed circuit board manufacturing techniques. Each discrete printed circuit board segment of the array includes an insulating substrate 20, a mounting pad 22, and a conductive material such as copper deposited on the substrate to form continuous conductive paths 24. Nickel and gold are also typically deposited for this purpose. Paths 24 lead from mounting pad 22 to plated through-holes 26 which are also referred to herein as barrels. In the printed circuit art and herein, barrels comprise holes in the printed circuit board substrate 20, the inner surfaces of which are plated with a conductive coating similar to that used for the printed circuit paths. The edges of the array include partial or semicircular barrels 27. In most instances, the printed circuit substrate stock is available in copper coated form. Selected areas of the copper coating are etched away leaving the copper paths. Through-holes are drilled through the board in predetermined areas as at 26. The through-holes, the area surrounding them and the copper paths may then be plated with gold and nickel or the like to provide plated through-holes 26, etc.

As can be seen in the lower left corner of FIG. 7, when the array is cut apart by cutting the printed circuit board segments along the aligned barrels 26, discrete printed circuit board segments 30 are formed. The cut edges of each segment 30 carry semi-circular notches or indentations 28 formed when barrels 26 are bisected by the cutting step to provide partial barrels similar to those on the edges of the array at 27. These partial barrels 27 and 28 contain a conductive lining due to the presence of the deposited conductive coating material therein.

Before the array shown in FIG. 7 is cut apart, or following the cutting of the array into discrete printed circuit board segments, a circuit element such as a microelectronic chip or die is secured to mounting pad 22 as shown schematically at 32 in FIG. 9. Circuit element 32 is appropriately connected by means of leads 34 to the various printed circuit paths 24 as schematically shown. There is thus provided a continuous electrical path between the various portions of electrical circuit element 32 and the various barrels 26 and partial barrels, 27 and 28 which later function as electrical contacts 16 on the key.

The opposite side of each printed circuit board segment may also carry printed circuit paths and so forth. This can be seen with reference to FIG. 8 which shows the opposite side of segment 30. The opposite side in this particular instance includes a number of printed circuit pathways 25 which extend between oppositely disposed barrels 27-28 along the edges of the segment. Oppositely disposed barrels 27-28 are thus electrically connected. When the printed circuit paths for each pair of barrels are arranged on the first side of the board for connection via the circuit pathways to the same elements of the circuit element to be mounted on mounting pad 22, the paired barrels function as back-ups for each other in the device.

Two articles in the Sept, 1977, Edition of *Scientific America*, entitled "The Fabrication of Microelectronic Circuits", pages 111-128, and "Microelectric Memories", pages 130-145, describe microelectronic circuit components generally similar to the kind of component, although not the particular circuit, which may be used as element 32 in key 10. These articles are both incorporated herein by reference.

The first article describes at page 126 a packaging technique used as a final step in the manufacture of microelectronic circuits. In this technique, each of the dies are fastened to a metal stamping known in the art as a lead frame. Fine wire leads are connected between the bonding pads of each die and the electrodes of the package in a plastic cover is molded around each individual die and lead frame with the package electrodes extending exteriorly thereof for establishing electrical contact with the package die.

These conventional techniques with some other modifications may be used to advantage in manufacturing of the insertion devices of this invention.

Following mounting of the circuit element 32 on the printed circuit board and cutting of the array as described above, a key body or other body shape is then molded around the printed circuit assembly as schematically shown in FIG. 9 to enclose various portions thereof while leaving at least parts of the partial barrels 27 and 28 exposed to form electrical contacts 16.

Generally, the idea of the invention is to form, preferably by molding, the insertion device body such as a key, credit card body or identification tag body around a printed circuit segment which has been prepared substantially as described above to include a circuit element 32 appropriately mounted thereon and connected to the conductive paths which lead to barrels 26, 27 and 28 or to otherwise incorporate the segment into the device in such a manner as to make the barrels on the edges available for use as the device electrical contacts.

Preferably the key 10 or other insert body will be made of a molded non-conductive plastic such as polybutylene terephthalate which is available from General Electric Company, Plastics Operations, Valox Products Dept. One Plastics Ave., Pittsfield, MA 01201 as Valox ®. Also, polyphenylene sulfide may be used. It is available as Ryton R-9 from Phillips Plastics Corp., P.O. Box 22, Philips, WI 54555. Other satisfactory materials will also be apparent to those familiar with the plastic molding art. Injection molding techniques are readily adaptable to the manufacture of these devices.

As can be seen by referring to FIGS. 3-6, the resultant molded key contains a printed circuit board or other substrate 20 enclosed within its body, the substrate carrying printed circuit paths 24, and the other circuit elements, which may be included on both sides of the printed circuit board, if desired.

It is to be understood that any arrangement of printed circuit paths, barrels and circuit elements may be utilized along with any configuration of insertion body device so long as the barrels may be appropriately exposed on edges of the printed circuit substrate to provide electrical contact for the device.

For example, with reference to FIGS. 10-13, another embodiment of the invention is the form of an identification tag 40 is disclosed. In FIGS. 10-13 elements similar to those shown in FIGS. 1 through 9 are identified by the same numbers.

Figure 10:
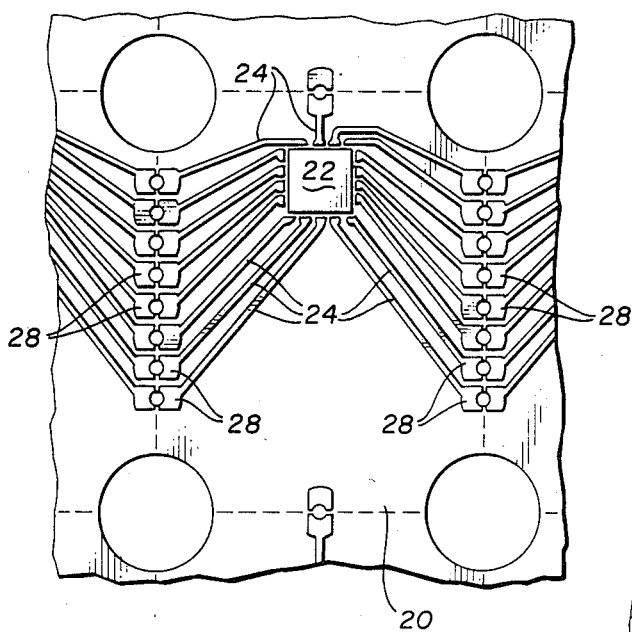
FIG. 10 is a schematic face view of a typical identification tag printed circuit substrate segment array in repetitive pattern.
Figure 11:
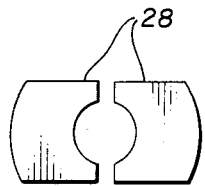
FIG. 11 is an enlarged portion of FIG. 10 showing contact pads in detail.
Figure 12:
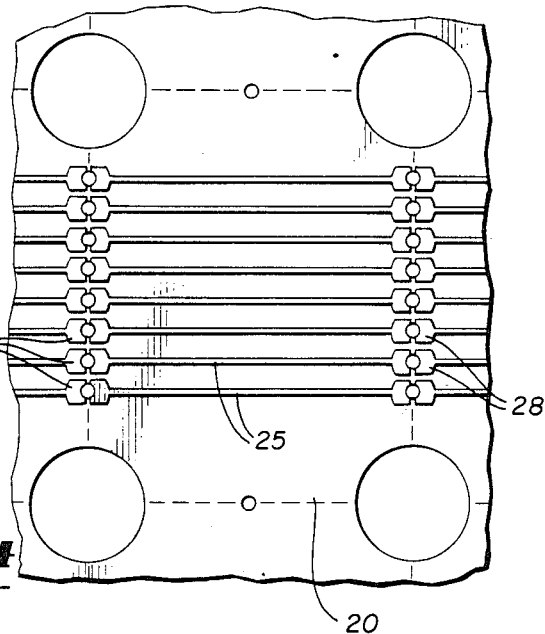
FIG. 12 is an opposite face view of the schematic circuit board array shown in FIG. 10.

FIGS. 10 and 12 schematically show opposite faces of a segment of an array on a printed circuit board each segment of which includes an insulating substrate 20, a mounting pad 22 and a conductive material such as copper deposited on the substrate to provide continuously conductive paths 24. Paths 24 terminate at the edges of each circuit board in a series of conductive pads 28. Similar pads 28 are juxtaposed on adjacent segments of the array as shown in the FIGS. 10, 11, and 12. The arrangement of pads 28 in spaced juxtaposition provides a cutting path therebetween which facilitates cutting of the segments into discrete elements. The arrangement is best seen in the detail of FIG. 11.

The array of FIGS. 10-12 is processed as described in the discussion of FIGS. 7-9. That is, the array may be drilled at pads 28 to provide the through-holes followed by plating to provide barrels which are located at the edges of each board segment upon cutting. Cutting may be readily accomplished by laser, diamond wheel, router or any other suitable means.

Figure 13:
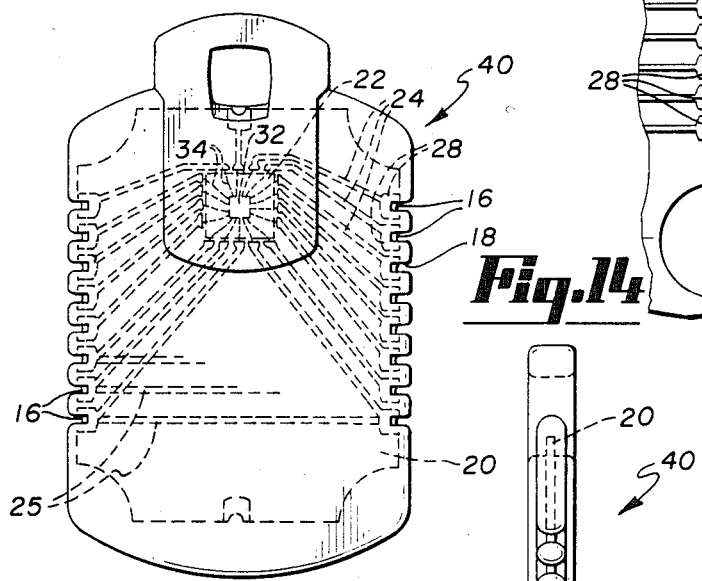
FIG. 13 is a top plan view of an indentification tag according to the invention.
Figure 14:
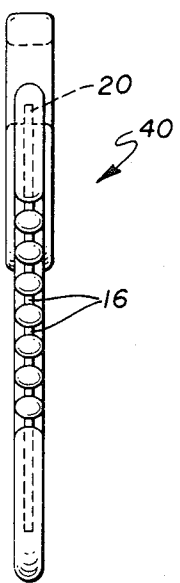
FIG. 14 is a side view of the tag shown in FIG. 13.

Once a circuit board segment is cut and separated from the array, it is then encased inside a body such as tag 40, shown in FIGS. 13 and 14. The tag includes electrical contacts 16 in spaced grooves 18 on opposite edges of the tag. Interiorly, the tag includes circuit element 32 and interconnecting leads 34 leading to conductive paths 24 and to contacts 16. Again, preferably the body of tag 40 will be a suitable plastic as already described for the key embodiment.

It can be seen that the invention provides unique electronic packaging and electrode access that facilitates the simplified manufacture of portable electronic devices such as keys and the like making use of microelectronic circuits or other electrical circuit components. The particular purpose of any microelectric or other circuit component utilized in the devices of the invention is not important within the broad scope thereof. Any circuit that is portable and can augment any other existing circuit is usable in the context of this invention. The insertion devices are specifically designed for insertion into a receptacle and establishing mating contact with electrical contacts therein. The key-like devices are specifically designed for insertion into a receptacle and rotation therein to a "locked" position by twisting to establish contact with the receptacle electrical contacts. The "flat-form" devices such as credit card formats and identification tag formats require a different type of receptacle such as one which, during straight insertion will cause corresponding receptacle parts to move electrical contacts across the inserted device contact terminals, and as such, accomplish a "wiping" contact.

As can be seen from the foregoing description, flat extremely thin insertion devices are possible, the thickness thereof being limited only by the thickness of the printed circuit board substrate, the printed circuit paths thereon and the size of the electrical circuit element used therewith. Various standard printed circuit boards as are known in the art may be used. Also, very thick sheet-like substrate materials may be used such as flexible Kapton ® sheet, a polyimide film sold by duPont Corp.

What is claimed is:

1. As an article of manufacture, a portable electronic device constructed and arranged for insertion into a mating receptacle, comprising a device body and a printed circuit substrate board carried by the device body, the board including electronic circuit means and a plurality of spaced indentations provided by exposed portions of plated through-holes on the board, the indentations being arranged along the length of the board on at least one edge thereof, each indentation extending across the edge of the board from one surface thereof to the other and being provided with a plated conductive area originating from a portion of a plated through-hole as aforesaid which portion is exposed exteriorly of the device body whereby each indentation serves as an electrical contact surface for mating with contacts in the receptacle, and discrete conductive pathways extending between each of the conductive areas and the electronic circuit means on the printed circuit board.

2. The article of claim 1 in which the device body is molded plastic enclosing the printed circuit substrate.

3. The device of claim 1 wherein the insert body is thin relative to its length and width, the grooves are on an edge of the insert body and are transverse of the insert body with respect to its insertion direction.

4. The device of claim 1 wherein the insert body defines two opposed contact surfaces including spaced grooves on each and the circuit substrate also includes corresponding opposed edges provided with conductive indentation areas.

5. The device of claim 1 wherein at least portions of the conductive surface areas are positioned at the bottoms of the grooves.

6. The device of claim 1 in the form of a key.

7. The device of claim 1 in the form of a substantially flat device.

8. The device of claim 1 in the form of a tag.

9. A method of making a portable electronic device which is adapted to be inserted into an electrical device and make electrical contact therewith by means of mating electrical contacts, the method comprising the steps:
    providing an array of printed circuit substrate segments wherein each individual substrate segment includes a mounting pad for receiving an electronic circuit means, plated terminals arranged in a predetermined aligned pattern, and a plurality of discrete printed circuit paths on the substrate extending from the pad to terminate in a series of plated through-holes;
    separating at least one individual printed circuit substrate segment from the array by cutting it out of the array, the segment being formed on at least one edge thereof by means of a cut through the aligned terminals so as to form a plurality of conductive indentations along at least one edge of the segment;
    mounting an electronic circuit means on the mounting pad of the segment and connecting various parts of the circuit means to the printed circuit paths on the substrate segment so as to provide electrical connection between the mounted circuit means and the conductive indentations on the edges of the segment;
    forming a body around the substrate segment so as to enclose the segment proper while leaving at least a portion of each of the conductive edge indentations thereof exposed so as to serve as electrical contacts for the device thus made.

10. The method of claim 9 wherein the through-holes are arranged in at least one in-line pattern.

11. The method of claim 9 wherein the body is plastic and it is formed by molding.

12. The method of claim 11 wherein the plastic body is made in the form of a key.

13. The method of claim 9 wherein the circuit means is mounted prior to the separating step.

14. The method of claim 11 wherein the plastic body is substantially flat.

15. The method of claim 11 wherein the plastic body is made in the form of an identification tag.

16. The method of claim 9 wherein the in-line through-holes are arranged in two oppositely disposed in-line patterns so as to provide opposite edges of the substrate segment with indented contacts.

17. In the method of claim 9 wherein contact pads are formed around the plated through-holes, the improvement wherein the pads are segmented so as to provide a predetermined cutting path for the substrate segments.

18. A method of making a portable electronic device which is adopted to be inserted into an electrical device and make electrical contact therewith, the method comprising the steps:

providing a printed circuit board including a mounting pad for receiving an electronic circuit means, semi-circular conductive terminals arranged on at least one edge thereof and a plurality of discrete printed circuit paths on the board extending from the pad to the terminals;

mounting an electronic circuit means on the mounting pad and connecting various parts of the circuit means to the printed circuit paths so as to provide electrical connection between the circuit means and the terminals on the edges of the board;

forming a body around the circuit board so as to enclose the board proper while leaving at least a portion of each of the conductive terminals on the board exposed to serve as electrical contacts for the device.

* * * * *